United States Patent [19]

Okumura et al.

[11] 4,348,473
[45] Sep. 7, 1982

[54] DRY PROCESS FOR THE PRODUCTION OF MICROELECTRONIC DEVICES

[75] Inventors: Koji Okumura, Rochester; Franklin D. Saeva, Webster, both of N.Y.

[73] Assignee: Xerox Corporation, Stamford, Conn.

[21] Appl. No.: 240,354

[22] Filed: Mar. 4, 1981

[51] Int. Cl.³ .................................................. G03C 5/00
[52] U.S. Cl. .................................... 430/296; 430/311; 430/313; 430/318; 430/319
[58] Field of Search ............... 430/296, 311, 312, 313, 430/314, 318, 319

[56] References Cited

U.S. PATENT DOCUMENTS

| | | | |
|---|---|---|---|
| 3,113,896 | 12/1963 | Mann | 430/313 |
| 3,885,076 | 5/1975 | Heidenreich et al. | 427/195 |
| 3,920,454 | 11/1975 | Thompson | 156/7 |
| 4,080,721 | 3/1978 | Hung | 204/15 |
| 4,102,733 | 7/1978 | Delamoneda et al. | 156/653 |
| 4,114,255 | 9/1978 | Salsbury et al. | 29/571 |

*Primary Examiner*—Jack P. Brammer

[57] ABSTRACT

A dry process for the manufacture of microelectronic devices from a work piece, which may be carried out entirely in a vacuum chamber, and which involves the coating of the work piece with a thin film of a monomer, selectively polymerizing the monomer according to a pattern of the microelectronic device desired, heating the layer of monomer to evaporate unpolymerized monomer to expose electronic circuit materials thereunder, removing the exposed electronic circuit materials, and stripping the polymerized monomer resist from the surface of the work piece.

9 Claims, 6 Drawing Figures

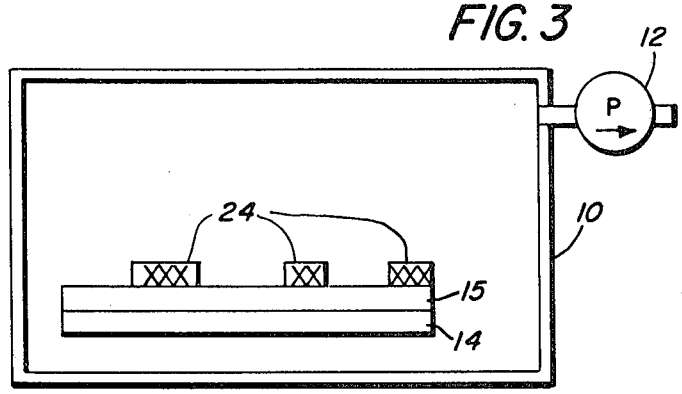
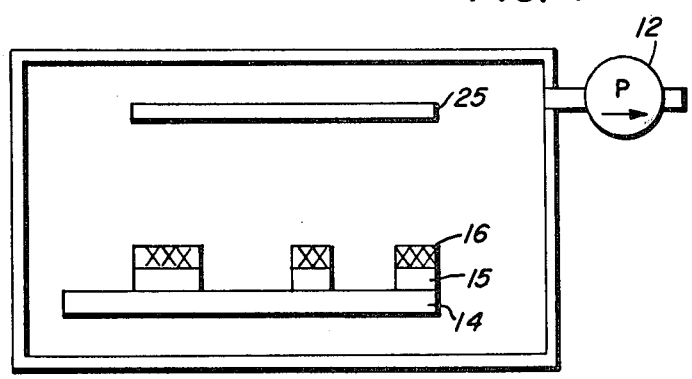
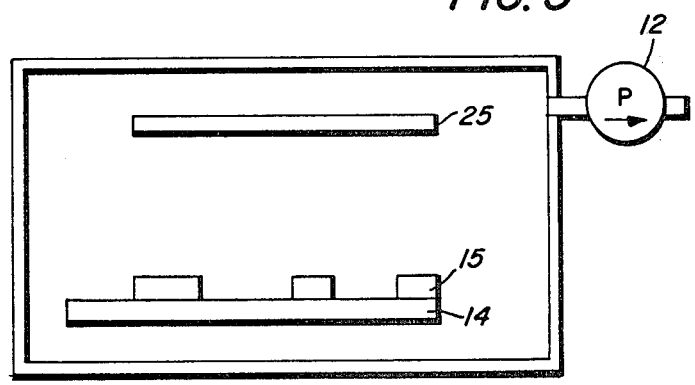

DRY PROCESS FOR THE PRODUCTION OF MICROELECTRONIC DEVICES

This invention relates to an improved method for the production of microelectronic devices.

BACKGROUND OF THE INVENTION AND PRIOR ART STATEMENT

It is known in the art to fabricate microelectronic devices, such as semiconductive devices and integrated circuits, by the use of a masking-etching operation to open windows in layers of various electronic circuit materials, such as semiconductors, conductors, and insulators. In such prior art methods, the masking material employed may be an organic polymer. The etching step then consists of immersion of the masked device in an etching solution, such as an aqueous solution of an acid. See, e.g., the processes described in U.S. Pat. Nos. 3,885,076 and 4,080,721.

There are a number of disadvantages associated with such prior art processes which drastically and adversely affect the yield from such processes. The masking material used in such processes is generally an organic polymer, which is usually solvent coated onto the device to be masked, or deposited thereon by vapor phase deposition in a vacuum chamber. After the masking material has been deposited and selectively hardened or cross-linked photochemically or by an electron beam, the masked device must be withdrawn from the vacuum chamber for etching with etching solution. When the masked device is withdrawn from the vacuum chamber and etched, dust particles and other materials may adhere to the surface of the device, resulting in a defective device. Physical damage to the devices may occur during such handling. When the masked device is etched, the etching solution may leave impurity particles on the surface of the device to again result in a defective device. Other causes for defective devices in such an etching operation are also known to those skilled in the art.

Various prior art methods for making microelectronic devices are shown, for example, in U.S. Pat. Nos. 3,885,076; 3,920,454; 4,080,721; 4,102,733 and 4,114,255. U.S. Pat. No. 3,885,076 is illustrative of the prior art process in inserting, withdrawing and then re-inserting the work piece into a vacuum chamber. In FIG. 1 of that patent, a work piece is coated with a film of a polymer which is then selectively crosslinked by exposure to an electron beam in accordance with a desired pattern. In FIG. 2 of that patent, the work piece was withdrawn from the vacuum chamber and the uncrosslinked portion of the film was dissolved to develop the pattern. FIG. 3 of that patent illustrates the etching of the portion of the substrate unprotected by the crosslinked film. After further processing, the work piece may then be re-inserted into the vacuum chamber for additional treatment, such as doping of the semiconductor by means of ion implantation.

In view of the foregoing, there is a continuing need for an improved method for making microelectronic devices.

Accordingly, it is an object of present invention to provide an improved method for the fabrication of microelectronic devices.

It is another object of the present invention to provide a novel method for the making of microelectronics devices which can be carried out entirely in the dry state, without the need for any etching solutions.

Other objects of the invention can be gathered from the following disclosure.

SUMMARY OF THE INVENTION

The above objects are accomplished in accordance with the present invention by a process for the fabrication of microelectronic devices which may be carried out entirely in the dry state. This is made possible by the use of a masking material, for the work piece, which is a monomer rather than a polymer. As a result, the entire fabrication process may be carried out in a vacuum chamber seriatim, without the use of wet solutions and without the need for withdrawal and re-insertion of the work piece to and from the vacuum chamber. A basic and elementary embodiment of the process of the present invention would comprise: providing a work piece, which may be composed of a substrate having one or more layers of electronic circuit materials coated thereon, in a vacuum chamber and carrying out all subsequent processing steps in said chamber; depositing a thin layer of a masking monomer on the coated substrate while maintaining the substrate below the vaporization temperature of the monomer; selectively polymerizing the monomer according to a pattern of the microelectronic device desired; heating the substrate to evaporate unpolymerized monomer to expose the coated substrate under unpolymerized areas; removing the electronic circuit materials so exposed; and removing the polymerized monomer mask.

BRIEF DESCRIPTION OF THE DRAWING

FIG. 3 illustrates the work piece after unpolymerized monomer has been permitted to be evaporated;

FIG. 4 illustrates the removal of exposed electronic circuit material, after evaporation of the unpolymerized monomer, by plasma etching with an RF electrode;

FIG. 5 illustrates the removal of the mask by plasma stripping; and

DETAILED DESCRIPTION OF THE INVENTION

The use of masking and photoresist techniques for the manufacture of microelectronic devices are now well known. One difficulty with such prior art techniques is the relatively low yield, which results in high manufacturing costs. The present invention provides a method for making such microelectronic devices in which all of the processing steps may be carried out in a vacuum chamber, or in the several compartments within a vacuum chamber, without the intermediate withdrawal of the work pieces from the vacuum chamber. In this manner, contacts with contaminating environments and damage through physical contacts are minimized.

In accordance with the present invention, microelectronic devices are prepared by:

1. providing a work piece which is composed of a substrate having coated thereon one or more substantially uniform layers of electronic circuit materials;

2. depositing a thin layer of a monomer on the coated substrate in a vacuum chamber while maintaining the coated substrate at a temperature below the vaporization temperature of the monomer;

3. selectively polymerizing portions of the thin layer of monomer by electromagnetic radiation means according to a pattern of microelectronic device desired;

4. heating the coated substrate to evaporate unpolymerized monomer while permitting the further polymerization of the reacted monomer;

5. removing the electronic circuit materials exposed by the vaporization of the unpolymerized monomers; and 6. removing the polymerized monomer from the surface of the work piece.

It will be appreciated that steps 2-6, inclusive, are all to be carried out in the vacuum chamber, without the intermediate withdrawal and the reinsertion of the work piece to and from the vacuum chamber. These processing steps will now be described in detail with reference to the drawings where appropriate.

PROVISION OF THE WORK PIECE

This step is essentially the same as that in the prior art processes. For example, the work piece may be made of a conductive substrate having coated thereon a layer of a semiconductive silicon. Of course, other combinations of layers of semiconductors/conductors/insulators as required for the manufacture of particular microelectronic devices may be used. It is important that the substrate be formed so that the holding and transporting of the work piece within the vacuum chamber are facilitated. In addition, the substrate should be made to facilitate good thermal contacts with the holding device in the vacuum chamber.

DEPOSITION OF MONOMER

Figure 1:
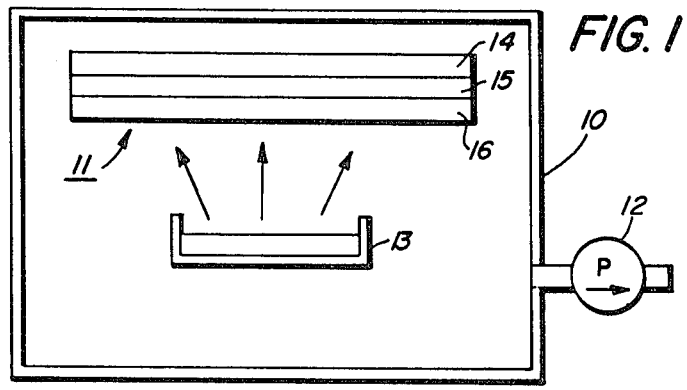
FIG. 1 is a schematic drawing showing the deposition of a film of monomer on the work piece in a vacuum chamber.

The deposition of a layer of monomer on the work piece takes place in a vacuum chamber. FIG. 1 schematically illustrates this step in the process of the present invention. In FIG. 1, a work piece 11 is provided within a vacuum chamber 10. The vacuum chamber is equipped with a vacuum pump 12, and mechanisms (not shown) for holding in place the work piece 11 and a source of the monomer 13. The monomer source 13 is provided with heating means (not shown) for heating and vaporizing the monomer during the deposition step. The work piece 11 is shown to be made of a conductive substrate 14 having a layer 15 of an electronic circuit material coated thereon. For example, layer 15 may be a layer of silicon or other semiconductor or insulator material. The precise nature of layers 14 and 15, and the possible presence of other layers in the work piece, depend on the microelectronic device to be produced. The thin film 16 of the monomer is shown to be deposited on layer 15.

The nature and the properties of the monomer employed is important. The monomer should have a proper vapor pressure, that is to say that the monomer should have a proper temperature of vaporization. Preferably, the monomer should have a vaporization temperature at or below that of the ambient temperature in the vacuum chamber. In that event, means for cooling the work piece should be provided so that the monomer vapor will condense and deposit onto the work piece. Such a cooling means may be in the form, for example, of a cold finger associated with the mechanism for holding the work piece 11 in the vacuum chamber. Monomers having vaporization temperatures, in the vacuum chamber, above the ambient temperature also may be used.

Other desirable characteristics of the monomer employed are: the film 16 of deposited monomer should have good adhesion to the work piece surface; the monomer is most preferably one that will condense in a homogeneous film; the monomer should be one that is readily polymerized by irradiation by an electron beam, via ionic or radical polymerization mechanisms; and film 16 of deposited monomer should be stable during the processing steps of the present invention. After polymerization, film 16 should be stable during the plasma etching or ion milling of the layer 15 of electronic circuit material. Examples of suitable monomers for use in the process of the invention include vinyl monomers such as vinylcarbazole and p-chloro-α-methylstyrene, and epoxy monomers. Other monomers which may be considered for use in the process of the invention include:

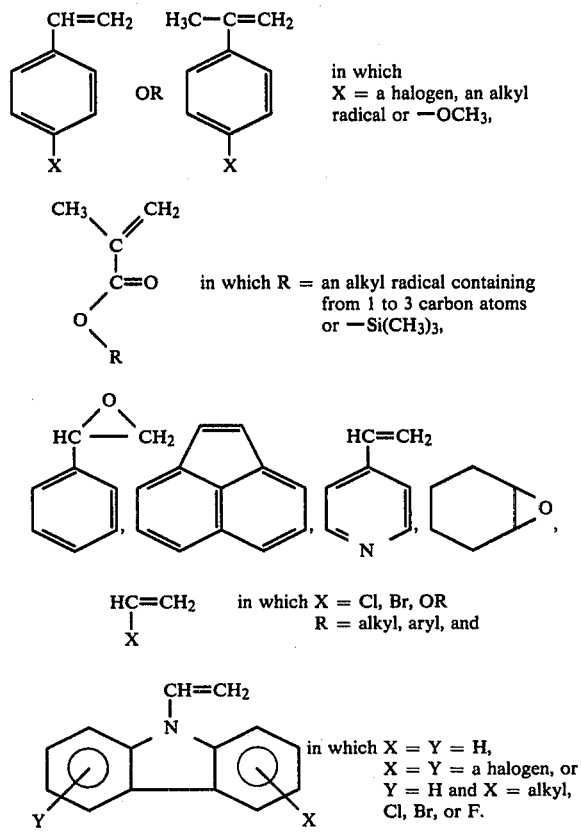

The pressure in the vacuum chamber is not critical. The vacuum need not be of an extremely high vacuum, and a pressure of, for example $10^{-5}$ torr is adequate.

POLYMERIZATION OF MASKING AREA

Figure 2:
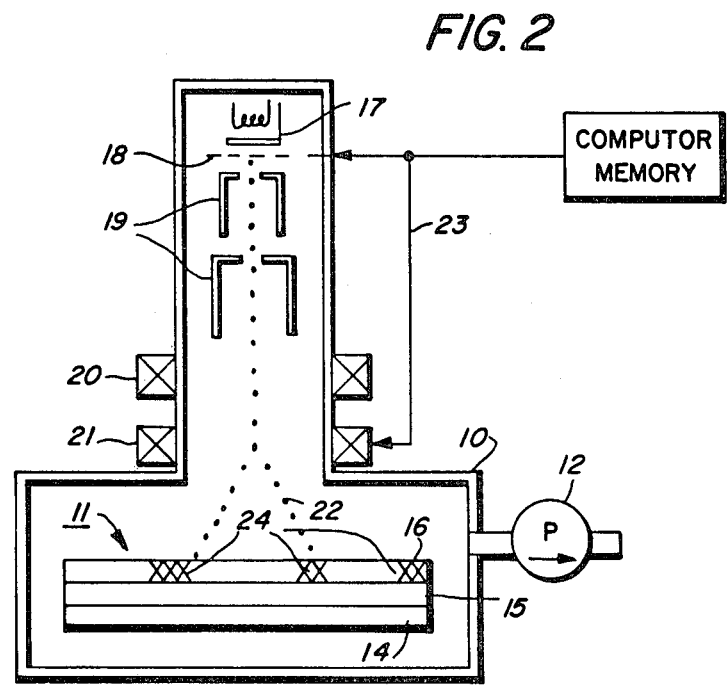
FIG. 2 is a schematic drawing showing the selective polymerization of the monomer on the work piece according to a design pattern by an electron beam device in the vacuum chamber.

The next step in the process of the invention is the polymerization of the deposited monomer in the area to be masked. This is to be done by an electron beam printout technique schematically illustrated in FIG. 2. In FIG. 2, a monomer coated work piece 11 is shown to be selectively irradiated by an electron beam in the areas to be masked. The electron beam is generated in an electron gun comprising a cathode 17, an anode and prefocus 19, control grid 18, fine focus coil 20, and deflection coil 21. The turning on and off of the beam is controlled by control grid 18, and the deflection of the beam is controlled by deflection coil 21. The "writing" of the desired pattern by the beam is controlled by signals 23 which may be, for example, generated from a computer memory input according to a design pattern of the microelectronic device desired. In the areas 24 on the monomer layer 16 which have been irradiated by the electron beam 22, polymerization of the monomer takes place.

In a specific example, N-vinylcarbazole was condensed onto a substrate held at about $-50°$ C. in the vacuum chamber at a pressure of about $10^{-6}$ torr. The deposited monomer layer was subjected to a raster scan irradiation by electron beam having an energy about 20 KeV, which resulted in a mixed monomer-polymer film that appeared white due to porosity. The polymerization occurred only in the areas irradiated by the electron beam.

REMOVAL OF UNPOLYMERIZED MONOMER

To complete the making of the polymeric mask for the microelectronic device, the unpolymerized monomer on the substrate must be removed. This is most conveniently done by raising the temperature of the substrate to the vaporization temperature of the monomer, or slightly above. For example, in the above embodiment of electron beam polymerization of a film of N-vinylcarbazole, the unpolymerized monomer was permitted to be evaporated by allowing the substrate to warm to ambient temperature in the vacuum chamber. During this warming step, further polymerization and/or crosslinking reactions occur in the irradiated areas 24. The result is a masked substrate as shown in FIG. 3.

REMOVAL OF EXPOSED UNDERLAYER

Once portions of the electronic circuit material in layer 15 is exposed by the removal of unpolymerized monomer, the areas so exposed may be etched or milled by techniques known in the art. For example, the layer 15 may be treated to a carbon tetrafluoride plasma etching, or an ion milling process with argon ions at 1 KeV. The resultant etched or milled substrate would appear as shown in FIG. 4. The radio frequency (RF) electrode 25 is used for the plasma etching step. Again, this step is also carried out in the vacuum chamber.

REMOVAL OF MASK

The final step in the basic embodiment of the present invention is the removal of the masking material or the stripping of the resist. This may be accomplished by plasma stripping in the vacuum chamber with an RF electrode 25, as shown in FIG. 5. The removal of thin polymer films by plasma is also well known in the art. For example, see, Taylor G. N. and Wolf, T. M. *Oxygen Plasma Removal of Thin Polymer Films*, POLYMER ENGINEERING & SCI 20 (16), pages 1087–1092, Mid-November, 1980. Alternatively, the final stripping of the resist material may be accomplished by solvent etching outside the vacuum chamber, though this is not preferred.

The foregoing describes the sequence of the steps employed in the manufacture of a single layered device on a substrate. When the method of the invention is to be used for the manufacture of a multi-layered device, such as a field effect transistor or an integrated circuit, the above sequence of steps can be repeated for each layer, as desired. The several layers of materials may be deposited onto the substrate in sequence, prior to inserting the work piece into the vacuum chamber. In this manner the various layers may be processed by a single pump down of the vacuum chamber.

A properly designed electron beam printout system should have a focused beam with a diameter of about 0.1 micron or less. Such a focused electron beam can be used to graphically reproduce digital data with an area density of about $10^9$ bits per square centimeter, or higher. To obtain such a high density and high resolution printout, it is important that the monomer layer 16 be deposited in a homogeneous form. The thickness of the monomer layer 16 should be controlled to be at about the same order of magnitude as the diameter of the writing electron beam.

The steps represented in FIGS. 1–5 may be carried out, seriatim, in a vacuum chamber which is divided into several compartments, connected by gate valves and preferably evacuated by separate pumps, with the work piece 11 passed to the compartments in sequence for the carrying out of the processing steps in each compartment. In such a setup, some of the processing steps may be combined and performed in the same compartment. For example, the steps represented in FIGS. 1 and 3 may be carried out in the same compartment. Again, the steps represented in FIGS. 4 and 5 also may be carried out in the same compartment. Alternatively, the entire sequence of steps may be carried out in a single compartment in the vacuum chamber by mounting the work piece on a holder which may be rotated by remote control. An example of such an arrangement is schematically illustrated in FIG. 6.

Figure 6:
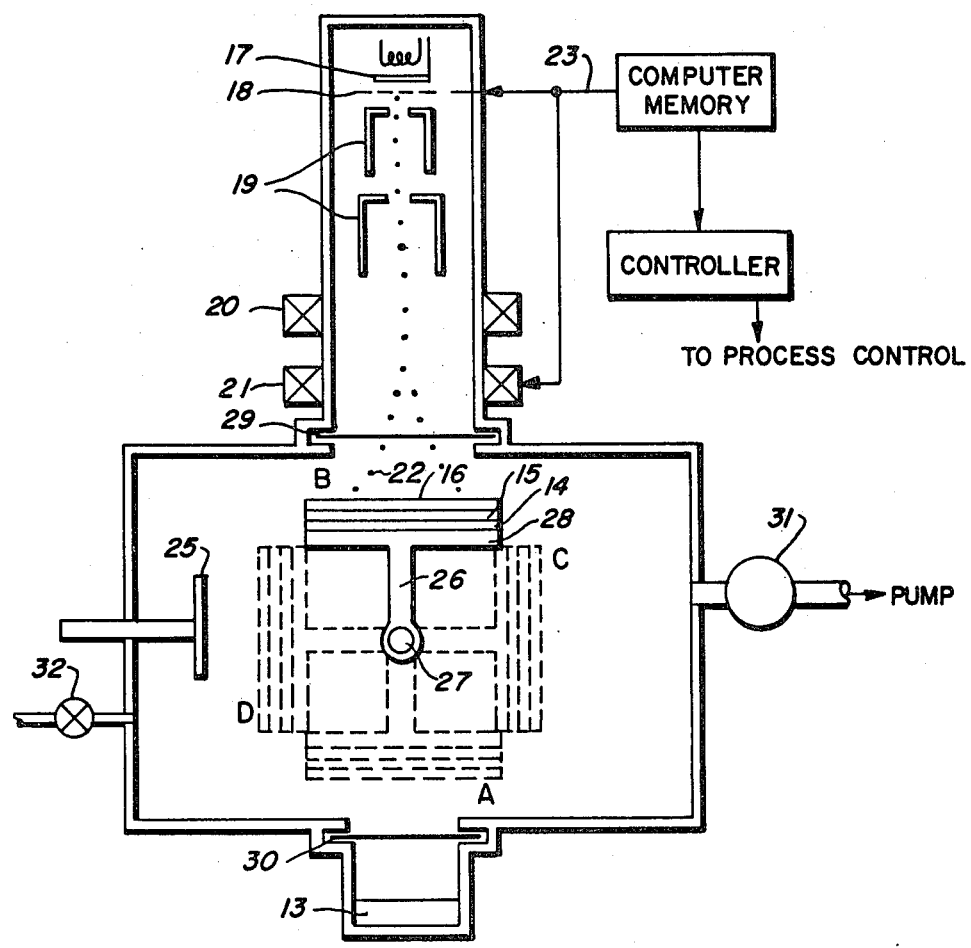
FIG. 6 is a schematic drawing showing one method for carrying out all the steps of the invention in a vacuum chamber.

In FIG. 6, the work piece 11 is mounted on a temperature controlled substrate holder 28, which is attached to a mounting arm 26 connected to a rotatable control 27 which may be remotely controlled for rotation. Initially, the work piece 11 is positioned in the place shown as position A. In this position, with the gate valve 30 in open position, the work piece 11 can easily receive the monomer from source 13 for deposition. After the film of monomer has been deposited onto the work piece, the gate valve 30 is closed and the mounting arm 26 is rotated 180°, to position B, so that the deposited layer on monomer 16 faces the electron beam 22. The gate valve 29, which was closed during the deposition of the monomer, is now opened. After processing by the electron beam 22 at position B, the mounting arm is rotated 90° clockwise to position C for the evaporation of unpolymerized monomer. The gate valve 29 is now again closed to minimize contamination of the electron beam apparatus. Thereafter, the mounting arm is again rotated 180° to position D for etching of the electronic circuit material and the stripping of the resist by the RF electrode 25. A valve 31 is provided in the line communicating with the vacuum pump. A gas leak valve 32 is also provided. In this manner, the microelectronic device can be made in the vacuum chamber through a sequence of processing steps, without having to withdraw the work piece 11 from the vacuum chamber for intermediate processing steps such as for treating by an etching solution.

It will be appreciated that the present invention provides a dry process for the manufacture of microelectronic devices, which does not require the use of any wet materials or etching solutions. The sequence of processing steps can be entirely carried out in the vacuum chamber, without the intermediate withdrawal and the re-insertion of the work piece to and from the vacuum chamber. In this manner, the possibility for damaging the work piece through handling has been greatly reduced. Other economic and handling advantages of the present invention would be apparent to those skilled in this art.

The invention has been described with particular reference to preferred embodiments thereof, it will be appreciated that various modifications may be made from the specific details without departing from the spirit and scope of the invention.

What is claimed is:

1. A method for the preparation of microelectronic devices which comprises:

providing in a vacuum chamber a substrate having coated thereon one or more substantially uniform layers of electronic circuit materials, and carrying out the following steps seriatum without intermediate withdrawal and re-insertion of the coated substrate from the vacuum chamber;

applying reduced pressure to the vacuum chamber;

depositing a thin layer of a monomer on said coated substrate while maintaining the coated substrate below the vaporization temperature of the monomer at the pressure within the vacuum chamber;

selectively polymerizing said thin layer of monomer by electromagnetic radiation or electron beam means according to a pattern of the microelectronic device desired;

heating said selectively polymerized thin layer to evaporate unpolymerized monomers to thus expose the coated substrate under the layer of monomer according to said pattern;

removing the electronic circuit materials so exposed; and removing the layer of polymerized monomer from the coated substrate.

2. A method according to claim 1 in which the coated substrate is maintained at about $-50°$ C. in a vacuum chamber maintained at about $10^{-5}$ to $10^{-6}$ torr during the deposition of the thin layer of monomer.

3. A method according to claim 2 in which the thin layer of monomer is selectively polymerized by an electron beam device controlled by a raster scan input.

4. A method according to claim 3 in which the electron beam is focused to a diameter of about 0.1 micron.

5. A method according to claim 2 in which the unpolymerized monomer is evaporated by permitting the monomer coated substrate to come to ambient temperature.

6. A method according to claim 2 in which the exposed electronic circuit materials are removed by a plasma etching process.

7. A method according to claim 2 in which the mask of polymerized monomer is removed from the coated substrate by plasma stripping.

8. A method according to claim 2 in which the monomer is a vinyl monomer or an epoxy monomer.

9. A method according to claim 8 in which the monomer is N-vinylcarbazole.

* * * * *